(12) United States Patent
Sun et al.

(10) Patent No.: US 11,540,404 B2
(45) Date of Patent: Dec. 27, 2022

(54) SUPPORTING STRUCTURE, MANUFACTURING METHOD THEREOF, DISPLAY APPARATUS AND ASSEMBLING METHOD THEREOF

(71) Applicant: BOE TECHNOLOGY GROUP CO., LTD., Beijing (CN)

(72) Inventors: Baofeng Sun, Beijing (CN); Shangchieh Chu, Beijing (CN); Yonghong Zhou, Beijing (CN); Xiaofei Luo, Beijing (CN); Yanyan Yang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 55 days.

(21) Appl. No.: 17/256,118

(22) PCT Filed: Apr. 13, 2020

(86) PCT No.: PCT/CN2020/084459
§ 371 (c)(1),
(2) Date: Dec. 24, 2020

(87) PCT Pub. No.: WO2020/216090
PCT Pub. Date: Oct. 29, 2020

(65) Prior Publication Data
US 2021/0127513 A1 Apr. 29, 2021

(30) Foreign Application Priority Data
Apr. 25, 2019 (CN) .......................... 201910338850.5

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC .. H05K 5/0217; H05K 5/0017; G06F 1/1626; G06F 1/1637; G06F 1/1652; G09F 9/301
See application file for complete search history.

(56) References Cited

U.S. PATENT DOCUMENTS

| 9,980,373 | B2 | 5/2018 | Jeong et al. |
| 10,555,414 | B2 * | 2/2020 | Park ....................... H05K 1/028 |

(Continued)

FOREIGN PATENT DOCUMENTS

| CN | 103000087 A | 3/2013 |
| CN | 104103217 A | 10/2014 |

(Continued)

OTHER PUBLICATIONS

International search report of PCT application No. PCT/CN2020/084459 dated Jun. 30, 2020.

(Continued)

*Primary Examiner* — Hung S. Bui
*Assistant Examiner* — Sagar Shrestha
(74) *Attorney, Agent, or Firm* — Fay Sharpe LLP

(57) ABSTRACT

A supporting structure includes a supporting structure body and a fixing member fixedly connected to the supporting structure body. The supporting structure body is located in a gap inside a bending part of a bending structure of a display apparatus, a first end of the bending structure is fixedly connected to a front surface of a display panel in the display apparatus, a second end of the bending structure is located on a back of the display panel, and the first end and the second end are opposite ends. The display apparatus further (Continued)

includes a housing at least wrapping the bending part of the bending structure, and the fixing member is fixedly connected to the housing.

19 Claims, 17 Drawing Sheets

(56) References Cited

U.S. PATENT DOCUMENTS

| | | | |
|---|---|---|---|
| 10,869,388 B2* | 12/2020 | Park | H01L 51/5253 |
| 11,068,029 B2* | 7/2021 | Jeong | G06F 1/1626 |
| 11,163,334 B2* | 11/2021 | Kang | H04M 1/185 |
| 2008/0297998 A1* | 12/2008 | Choi | H04N 5/64 |
| | | | 361/679.02 |
| 2013/0070399 A1 | 3/2013 | Liu et al. | |
| 2014/0307396 A1 | 10/2014 | Lee | |
| 2016/0275830 A1* | 9/2016 | You | G02F 1/133305 |
| 2016/0325820 A1 | 11/2016 | Evans | |
| 2018/0184530 A1 | 6/2018 | Wang | |
| 2018/0210513 A1 | 7/2018 | Lin | |
| 2019/0073002 A1* | 3/2019 | Wu | G06F 1/1616 |
| 2019/0075669 A1* | 3/2019 | Heng | G06F 1/1652 |
| 2020/0057472 A1* | 2/2020 | Kang | H05K 3/388 |
| 2020/0136085 A1* | 4/2020 | Wang | H05K 5/03 |
| 2021/0041916 A1* | 2/2021 | Zhang | G06F 1/1641 |
| 2021/0084778 A1* | 3/2021 | Zhou | H05K 5/0017 |
| 2021/0168973 A1* | 6/2021 | Sim | G02F 1/1345 |

FOREIGN PATENT DOCUMENTS

| | | |
|---|---|---|
| CN | 106114818 A | 11/2016 |
| CN | 106816095 A | 6/2017 |
| CN | 207053559 U | 2/2018 |
| CN | 207637436 U | 7/2018 |
| CN | 108847136 A | 11/2018 |
| CN | 108877519 A | 11/2018 |
| CN | 108962035 A | 12/2018 |
| CN | 208595386 U | 3/2019 |
| CN | 109903681 A | 6/2019 |
| JP | H066050 A | 1/1994 |
| JP | 2005203432 A | 7/2005 |
| KR | 20140122595 A | 10/2014 |
| KR | 20150061769 A | 6/2015 |

OTHER PUBLICATIONS

First office action of Chinese application No. 201910338850.5 dated Sep. 3, 2020.
Second office action of Chinese application No. 201910338850.5 dated Mar. 1, 2021.

* cited by examiner

SUPPORTING STRUCTURE, MANUFACTURING METHOD THEREOF, DISPLAY APPARATUS AND ASSEMBLING METHOD THEREOF

CROSS-REFERENCE TO RELATED APPLICATIONS

This application is a 371 of PCT Application No. PCT/CN2020/084459, titled "SUPPORT STRUCTURE AND FABRICATION METHOD THEREFOR, AND DISPLAY DEVICE AND ASSEMBLY METHOD THEREFOR", filed on Apr. 13, 2020, which claims priority to Chinese Patent Application No. 201910338850.5 filed on Apr. 25, 2019 and titled "SUPPORTING STRUCTURE, MANUFACTURING METHOD THEREOF, DISPLAY APPARATUS AND ASSEMBLING METHOD THEREOF", which is incorporated herein by reference in its entirety.

TECHNICAL FIELD

The present disclosure relates to a supporting structure, manufacturing method thereof, a display apparatus and assembling method thereof.

BACKGROUND

A flexible display apparatus has the advantages of bendability, flexibility, lightness and thinness of volumes, etc., and is widely used in electronic devices such as mobile phones and computers.

A flexible display apparatus usually includes a flexible display panel, a flexible circuit board (FCB), a bendable conductive structure, and the like. The flexible circuit board is usually located on the back of the flexible display panel, and the bendable conductive structure is used to electrically connect the conductive line in the front of the flexible display panel to the flexible circuit board.

SUMMARY

In one aspect, a supporting structure is provided, and the supporting structure includes a supporting structure body and a fixing member fixedly connected to the supporting structure body.

The supporting structure body is configured to be located in a gap inside the bending part of the bending structure of the display apparatus, the first end of the bending structure is fixedly connected to a front surface of the display panel in the display apparatus, the second end of the bending structure is located on a back of the display panel, and the first end and the second end are opposite ends.

The display apparatus further includes a housing wrapping at least the bending part of the bending structure, and the fixing member is configured to be fixedly connected to the housing.

In another aspect, a display apparatus is provided, and the display apparatus includes a display panel, a bending structure in a bent state, a housing, and any supporting structure described in the first aspect, wherein the supporting structure includes a supporting structure body and a fixing member fixedly connected to the supporting structure body.

A gap is formed inside the bending part of the bending structure, the supporting structure body is located in the gap, the first end of the bending structure is fixedly connected to the front surface of the display panel in the display apparatus, the second end of the bending structure is located on the back of the display panel, and the first end and the second end are opposite ends.

The housing wraps at least the bending part of the bending structure, and the fixing member is fixedly connected to the housing.

In another aspect, a method for manufacturing a supporting structure is provided, and the method includes:

providing a plate-like structure;

disposing at least one rabbet at one end of the plate-like structure, the rabbeted plate-like structure being divided into a plate-like structure body and at least two sub-structures connected to the plate-like structure body, and every two adjacent substructures being separated by one rabbet; and folding at least one of the substructures in half along a first fold line to obtain a supporting structure body and a fixing member fixedly connected to the supporting structure body, wherein the at least one substructure folded in half and the plate-like structure body constitute the supporting structure body.

In another aspect, a method for assembling a display apparatus is provided, and the method includes:

providing a display panel, a supporting structure, a housing, and a bending structure, the supporting structure including a supporting structure body and a fixing member fixedly connected to the supporting structure body;

fixedly connecting the first end of the bending structure to the front surface of the display panel, a second end of the bending structure being located on a back of the display panel, and the first end and the second end being opposite ends;

placing the supporting structure in the gap inside a bending part of the bending structure; and fixing the housing on the back of the display panel, and fixedly connecting the fixing member to the housing, so that the housing wraps at least the bending part of the bending structure.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

To make objectives, technical solutions and advantages of the present disclosure clearer, the embodiments of the present disclosure will be described in detail below in conjunction with the accompanying drawings.

Figure 1:
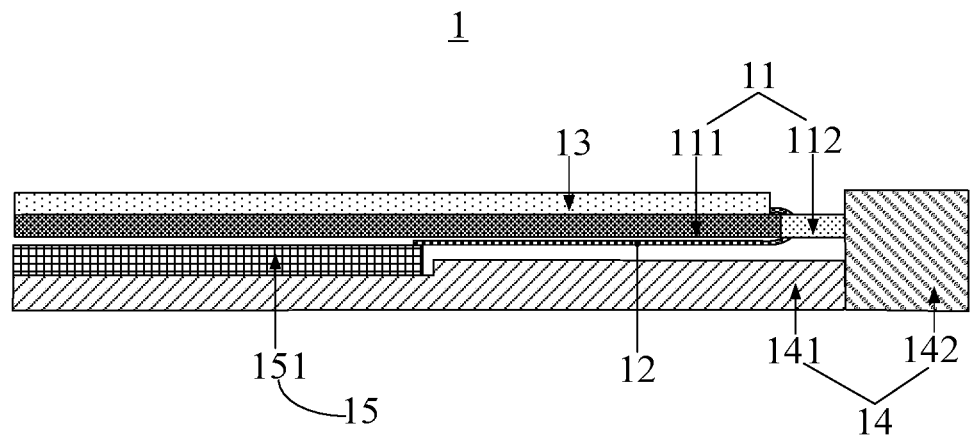
FIG. 1 is a schematic structural diagram of a display apparatus provided by an embodiment of the present disclosure.

The embodiment of the present disclosure provides a supporting structure and a display apparatus. FIG. 1 is a schematic structural diagram of a display apparatus provided by an embodiment of the disclosure. As shown in FIG. 1, the display apparatus 1 may include: a supporting structure 11, a bending structure 12 in a bent state, a display panel 13 and a housing 14 provided by an embodiment of the present disclosure.

A first end of the bending structure 12 is fixedly connected to a front surface of the display panel 13 (i.e., the light-emitting surface of the display panel 13), a second end of the bending structure 12 is located on the back of the display panel 13, and a gap is formed inside the bending part of the bending structure 12. The first end and the second end are opposite ends.

The housing 14 wraps at least the bending part of the bending structure 12. Optionally, the housing 14 may include a first sub-housing 141 and/or a second sub-housing 142, the first sub-housing 141 wraps a part of the bending structure that is bent to the back of the display panel, and the second sub-housing 142 wraps the bending part of the bending structure.

The supporting structure 11 may include a supporting structure body 111 and a fixing member 112 fixedly connected to the supporting structure body 111. The supporting structure body 111 is located in the gap inside the bending part to support the bending part of the bending structure 12. The fixing member 112 is fixedly connected to the housing 14 so that the supporting structure 11 and the housing 14 are fixedly connected.

Compared with the related art, since the supporting structure is fixedly connected to the housing, it is difficult for the supporting structure and the housing to move relative to each other. In addition, when the display apparatus is bent, it is difficult to alter the relative position of the housing and the bending structure so that it is difficult for the supporting structure and the bending structure to move relative to each other, which reduces the probability of the supporting structure body colliding with the bending structure at the bending part, and reduces the probability of occurrence of failure of the bending structure at the bending part, thereby reducing the probability of occurrence of display failure of the display apparatus.

Optionally, as shown in FIG. 1, the display apparatus may further include a flexible circuit board 15. The flexible circuit board 15 may include a flexible circuit board chip body 151 and a flexible circuit board outgoing line and the like (not shown) fixedly connected to the flexible circuit board chip body 151. The flexible circuit board chip body 151 is located on the back of the display panel 13. The display panel 13 may include a plurality of pixel units and a conductive line connected to each pixel unit.

At this time, the bending structure 12 may include a conductive structure, that is, the bending structure 12 is used to transmit electrical signals between the display panel and the structure located on the back of the display panel. For example, the conductive structure may be connected to the flexible circuit board outgoing line and the conductive line to transmit a driving signal from the flexible circuit board 15 to the pixel unit. The driving signal is used for the pixel unit to emit light. In this way, since the flexible circuit board chip body is located on the back of the display panel, there is no need to occupy the area of the front surface of the display panel, and thus the area of the non-display area in the display panel is reduced.

Figure 2:
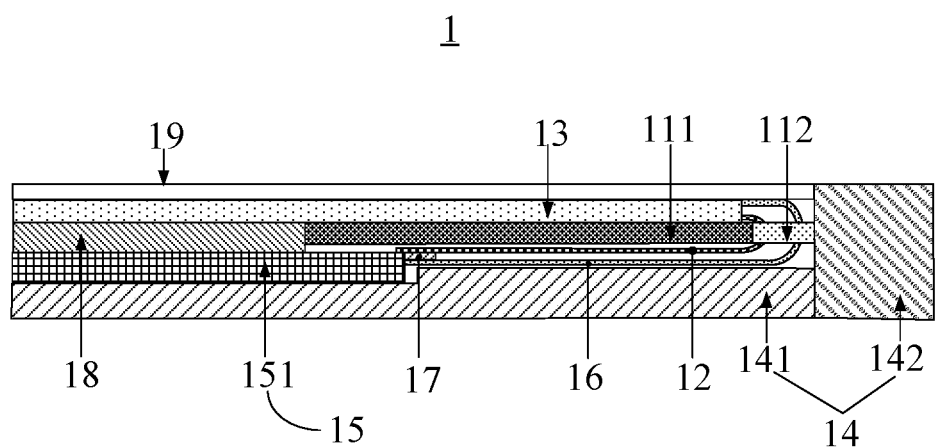
FIG. 2 is a schematic structural diagram of another display apparatus provided by an embodiment of the present disclosure.

In an implementation, as shown in FIG. 2, the display apparatus may further include a touch trace 16. Multiple touch electrodes may be provided on the light-emitting surface of the display panel 13. At this time, the touch trace 16 is used to electrically connect the touch electrode and the flexible circuit board chip body 151 to transmit the touch signal on the touch electrode to the flexible circuit board chip body 151. In addition, the display apparatus 1 may further include a touch integrated circuit 17. At this time, the flexible circuit board chip body 151 may transmit the received touch signal to the touch integrated circuit 17, so that the touch integrated circuit 17 may process the touch signal.

The bending structure 12 may also include a flexible substrate. The conductive structure is located on the flexible substrate. For example, in the process of manufacturing the display panel, the module structure and the integrated circuit (such as the conductive structure and the flexible circuit board chip body, etc.) of the display panel may be formed on the same side of the flexible substrate first, and then the integrated circuit is bent to the back of the display panel by bending the flexible substrate. In this way, it is possible to simplify the method for manufacturing the display apparatus based on reducing the area of the non-display area on the front surface of the display panel.

Optionally, as shown in FIG. 2, the display apparatus 1 may further include a middle frame 18. The middle frame 18 is located between the display panel 13 and the flexible circuit board chip body 151, and the middle frame 18 is located at an end of the supporting structure body 111 away from the bending part. The middle frame 18 is fixedly connected to the supporting structure 11. For example, the middle frame 18 is fixedly connected to the end of the supporting structure body 111 away from the bending part. The middle frame 18 is used to support the display panel and the flexible circuit board chip body 151. In addition, the material of the middle frame 18 may be an elastic material. In this way, when the display apparatus 1 falls, the middle frame 18 may provide a buffering force to the display panel, so as to reduce the probability of damage to the display panel due to impact with the ground.

As shown in FIG. 2, the display apparatus 1 may further include a cover plate 19 on the light-emitting side of the display panel 13. The cover plate 19 may be used to protect the display panel 13.

For example, the display apparatus may be any product or component with display function: an electronic paper, a mobile phone, a tablet computer, a television, a monitor, a notebook computer, a digital photo frame, a navigator, and so on.

In summary, in the display apparatus provided by the embodiment of the present disclosure, since the display apparatus includes a supporting structure including a supporting structure body and a fixing member, the supporting structure body is located in the gap inside the bending part of the bending structure, and the fixing member is fixedly connected to the housing, it is difficult for the supporting structure and the housing to move relative to each other. Compared with the related art, when the display apparatus is bent, it is difficult to alter the relative position of the housing and the bending structure so that it is difficult for the supporting structure and the bending structure to move relative to each other, which reduces the probability of the supporting structure body colliding with the bending structure at the bending part, and reduces the probability of occurrence of failure of the bending structure at the bending part, thereby reducing the probability of occurrence of display failure of the display apparatus.

Figure 3:
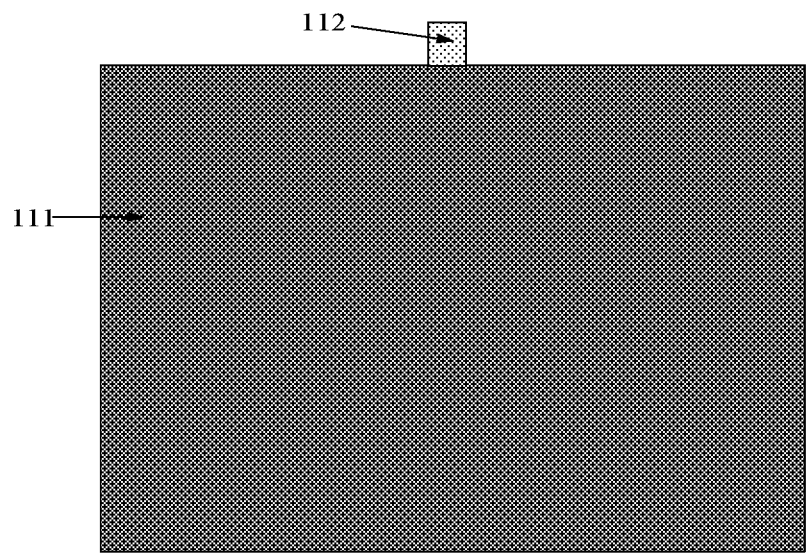
FIG. 3 is a schematic structural diagram of a supporting structure provided by an embodiment of the present disclosure.
Figure 4:
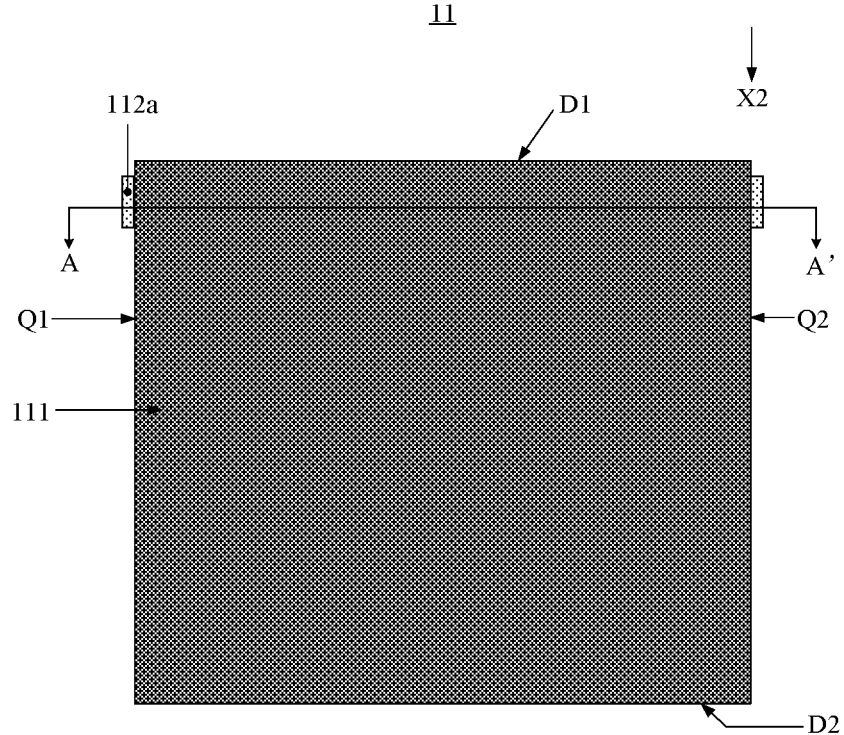
FIG. 4 is a schematic structural diagram of another supporting structure provided by an embodiment of the present disclosure.
Figure 5:
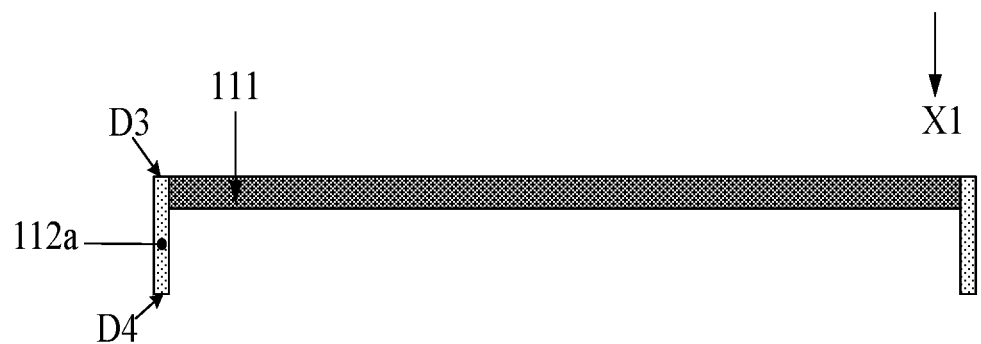
FIG. 5 is a schematic diagram of the supporting structure in FIG. 4 at position AA'.

FIGS. 3 to 5 are schematic structural diagrams of a supporting structure provided by embodiments of the present disclosure. As shown in FIGS. 1 to 5, the supporting structure 11 may include a supporting structure body 111 and a fixing member 112 fixedly connected to the supporting structure body 111.

The supporting structure body 111 is configured to be located in a gap inside the bending part of the bending structure 12 of the display apparatus 1, the first end of the bending structure 12 is fixedly connected to the front surface of the display panel 13 in the display apparatus 1, the second end of the bending structure 12 is located on the back of the display panel 13, and the first end and the second end are opposite ends.

The fixing member 112 is configured to be fixedly connected to the housing 14 close to the bending part. The housing 14 wraps at least the bending part of the bending structure 12.

In summary, the supporting structure provided by the embodiments of the present disclosure includes a supporting structure body and a fixing member, the supporting structure body is located in the gap inside the bending part of the bending structure, and the fixing member is fixedly connected to the housing, so that it is difficult for the supporting structure and the housing to move relative to each other. Compared with the related art, when the display apparatus is bent, it is difficult to alter the relative position of the housing and the bending structure so that it is difficult for the supporting structure and the bending structure to move relative to each other, which reduces the probability of the supporting structure body colliding with the bending part, and reduces the probability of occurrence of failure of the bending structure at the bending part, thereby reducing the probability of occurrence of display failure of the display apparatus.

Optionally, the fixing member and the housing in the supporting structure may be fixedly connected in a variety of implementations, which are illustrated by taking the following several implementations as examples.

In a first implementation, the fixing member may include at least one first fixing member configured to be fixedly connected to the first sub-housing 141.

The location of the first fixing member may be determined according to application requirements. In the first case, the at least one first fixing member may be located on the first surface of the supporting structure body 111, and the first surface is the surface of the supporting structure body excluding the surface for supporting the bending structure.

Figure 6:
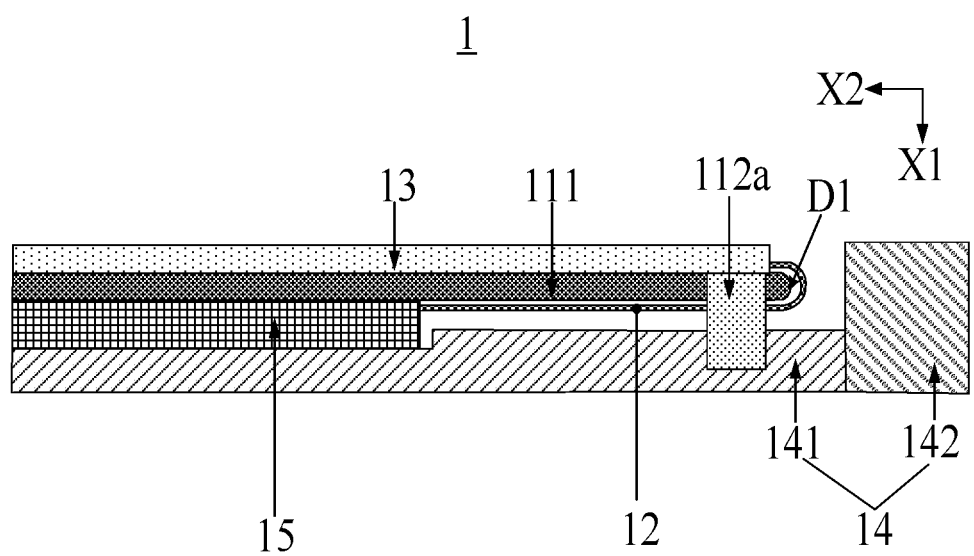
FIG. 6 is a schematic structural diagram of another display apparatus provided by an embodiment of the present disclosure.

As shown in FIGS. 4 to 6, the first surface may be the side of the supporting structure body 111, that is, the first fixing member 112a is located on the side of the supporting structure body 111, and the first fixing member 112a is configured to be fixedly connected to the first sub-housing 141. At this time, the extending direction X1 of the first fixing member 112a crosses the extending direction X2 of the supporting structure body 111.

The extending direction X1 of the first fixing member 112a may be the direction in which the maximum side length of the first fixing member 112a is located, and the extending direction X2 of the supporting structure body 111 may be the direction in which the maximum side length of the supporting structure body 111 is located. As shown in FIG. 5, the maximum side length of the first fixing member 112a is the side length in the direction of pointing to the fourth end D4 of the first fixing member 112a from the third end D3 of the first fixing member 112a, the third end D3 is used for fixedly connecting with the supporting structure body 111, and the fourth end D4 is used for fixedly connecting with the first sub-housing 141. As shown in FIGS. 4 and 6, the maximum side length of the supporting structure body 111 is the side length in the direction of pointing to the second end D2 of the supporting structure body 111 away from the bending part from the first end D1 of the supporting structure body 111 close to the bending part. FIG. 5 is a schematic diagram of the supporting structure in FIG. 4 at the position AA', and FIGS. 4 to 6 are all schematic diagrams showing the extending direction X1 of the first fixing member 112a are perpendicular to the extending direction X2 of the supporting structure body 111.

In the second case, the at least one first fixing member may be located on the second surface of the supporting structure body 111, and the second surface faces a part of the bending structure 12 bent to the back of the display panel 13.

Figure 7:
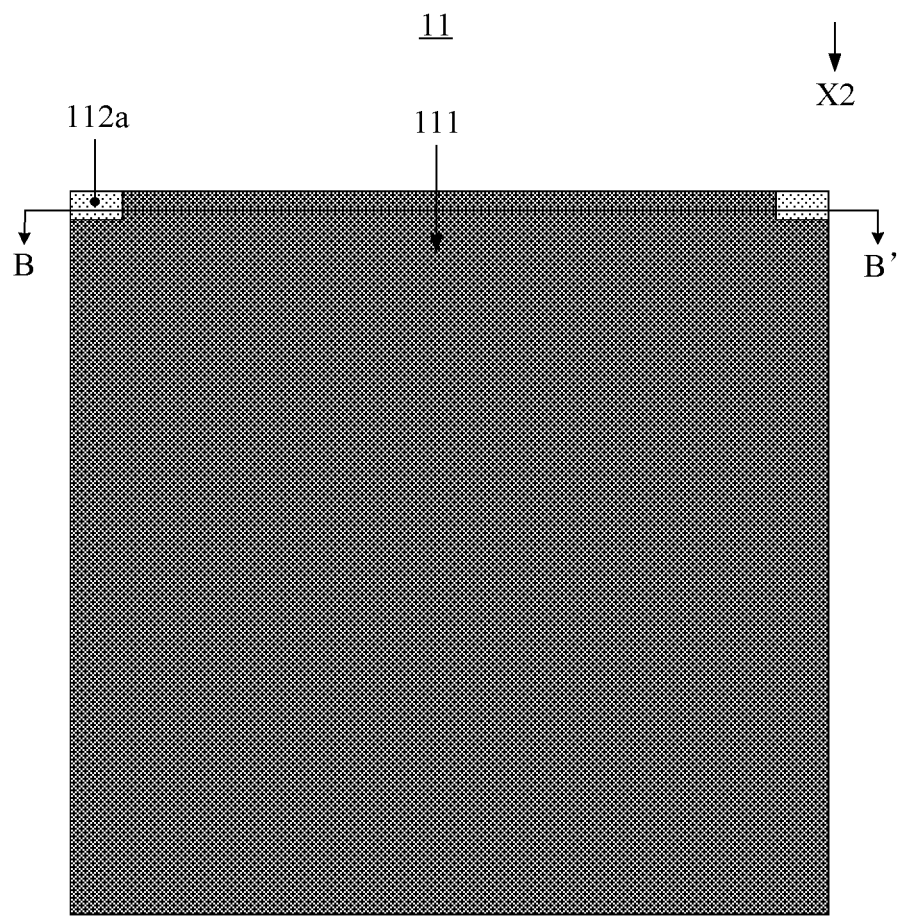
FIG. 7 is a schematic structural diagram of still another supporting structure provided by an embodiment of the present disclosure.
Figure 8:
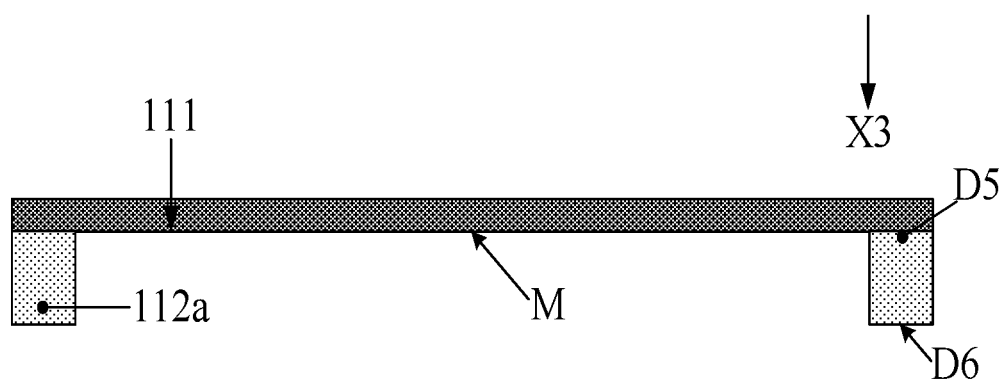
FIG. 8 is a schematic diagram of the supporting structure in FIG. 7 at position BB'.
Figure 9:
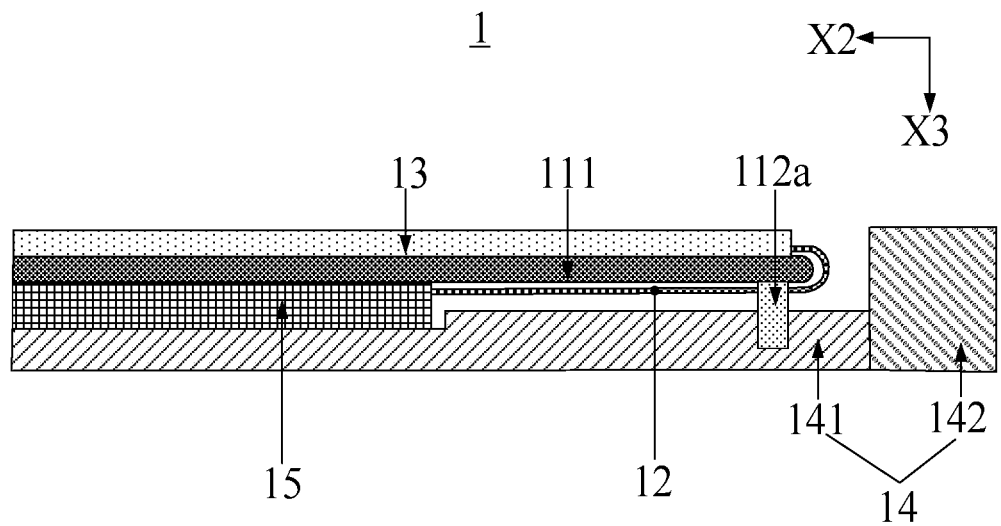
FIG. 9 is a schematic structural diagram of another display apparatus provided by an embodiment of the present disclosure.

As shown in FIGS. 7 to 9, the first fixing member 112a is located on the second surface M of the supporting structure body 111, and the first fixing member 112a is configured to be fixedly connected to the first sub-housing 141. The extending direction X3 of the first fixing member 112a crosses the extending direction X2 of the supporting structure body 111, and the extending direction X3 of the first fixing member 112a may be the direction in which the maximum side length of the first fixing member 112a is located.

As shown in FIG. 8, the maximum side length of the first fixing member 112a may be the side length in the direction of pointing to the sixth end D6 of the first fixing member 112a from the fifth end D5 of the first fixing member 112a, the fifth end D5 is used for fixedly connecting with the supporting structure body 111, and the sixth end D6 is used for fixedly connecting with the first sub-housing.

FIG. 8 is a schematic diagram of the supporting structure in FIG. 7 at the position BB', and FIGS. 7 and 8 are both schematic diagrams showing the extending direction X3 of the first fixing member 112a is perpendicular to the extending direction X2 of the supporting structure body 111.

Optionally, the first fixing member 112a may be of a strip-like structure. At this time, the extending direction of the first fixing member 112a may be the direction in which the length of the first fixing member 112a in a strip shape is located. Moreover, the supporting structure body 111 may also be of a strip-like structure. At this time, the extending direction of the supporting structure body 111 may be the direction in which the supporting structure body 111 in a strip shape is located. Moreover, the strip-like structure in the embodiment of the present disclosure may be a linear strip-like structure. Alternatively, the strip-like structure in the embodiment of the present disclosure may also be a nonlinear strip-like structure, for example, it may be a wavy strip-like structure or a zigzag strip-like structure.

Further, the supporting structure body 111 has at least one pair of first surfaces facing each other, and the fixing member 112 may include a plurality of first fixing members 112a. At this time, the plurality of first fixing members 112a may be symmetrically arranged on part or all of the at least one pair of first surfaces facing each other. Since the plurality of first fixing members 112a on each first surface may be fixedly connected to the first sub-housing 141, the stability of connection between the supporting structure body 111 and the first sub-housing 141 is improved, and the probability that the position of the supporting structure body 111 moves with respect to the first sub-housing 141 is further reduced.

For example, as shown in FIG. 4, the fixing member 112 may include two first fixing members 112a, the supporting structure body 111 has a pair of first surfaces facing each other, and the first surfaces facing each other are the first surface Q1 and the first surface Q2. At this time, one first fixing member 112a is located on the first surface Q1, and the other first fixing member 112a is located on the first surface Q2.

Moreover, when the position of the first fixing member on the surface of the supporting structure body 111 is different, the implementation of connection between the first fixing member and the first sub-housing is different. For example, when the orthographic projection of the first fixing member 112a on the first sub-housing 141 is outside the orthographic projection of the bending structure 12 on the first sub-housing 141, the first fixing member 112a may extend to the first sub-housing 141 via the side of the bending structure 12 and may be fixedly connected to the first sub-housing 141. When there is an overlap area between the orthographic projection of the first fixing member 112a on the first sub-housing 141 and the orthographic projection of the bending structure 12 on the first sub-housing 141, the bending structure 12 may be provided with a via, and the first fixing member 112a may pass through the via in the bending structure 12 and may be fixedly connected to the first sub-housing 141.

Optionally, the first fixing member 112a and the first sub-housing 141 may be fixedly connected in various ways, for example, an adhesive connection and/or a snap fit. For example, as shown in FIG. 6, the first sub-housing 141 may have a groove, and each first fixing member 112a may be snap-fitted in a groove. In this way, under the obstruction of the inner wall of the groove, it is difficult for the first fixing member 112a and the first sub-housing 141 to move relative to each other, and then it is difficult for the supporting structure body 111 and the first sub-housing 141 to move relative to each other.

The shape of the end for the snap fit with the groove of the first fixing member 112a may be complementary to the shape enclosed by the inner wall of the groove. Alternatively, the size of the first fixing member 112a in at least one direction may be the same as the size of the inner wall of the groove in the corresponding direction. For example, the at least one direction may be a direction perpendicular to the extending direction X1 of the first fixing member 112a.

In a second implementation, the fixing member may include at least one second fixing member configured to be fixedly connected to the second sub-housing.

The location of the second fixing member can be determined according to application requirements. For example, the second fixing member is located on a third surface of the supporting structure body towards the bending part. As shown in FIGS. 1, 10 to 13, the second fixing member 112b is located on the third surface D1 of the supporting structure body 111 towards the bending part, and the second fixing member 112b is configured to be fixedly connected to the second sub-housing 142.

At this time, it is relatively difficult for the supporting structure body 111 and the second sub-housing 142 to move relative to each other. Moreover, since the second fixing member 112b is located on the third surface D1 of the supporting structure body towards the bending part, it is difficult for the second fixing member 112b to move towards the second sub-housing 142 under the obstruction of the second sub-housing 142, so that it is difficult for the supporting structure body 111 to move towards the second sub-housing 142, thereby further reducing the probability of the supporting structure body 111 colliding with the bending part.

Optionally, the setting of the position of the second fixing member 112b on the third surface D1 may include multiple cases, and the embodiments of the present disclosure will be illustrated by taking the following three cases as examples.

In a first case, the fixing member 112 may include a plurality of second fixing members 112b, and the plurality of second fixing members 112b may be respectively located at both ends of the third surface D1, and the orthographic projection of both ends of the third surface D1 on the second sub-housing 142 does not overlap the orthographic projection of the bending structure 12 on the second sub-housing 142.

When the supporting structure 11 has a plurality of second fixing members 112b, a part of the plurality of second fixing members 112b may be located at one end of the two ends, and the other part may be located at the other end of the two ends. For example, referring to FIG. 10, the fixing members 112 may include two second fixing members 112b, one of the two second fixing members 112b is located at the left end of the third surface D1, and the other one is located at the right end of the third surface D1.

In a second case, the fixing member 112 may include at least one second fixing member 112b located in the middle area of the third surface D1, and there is an overlap area between the orthographic projection of the middle area on the second sub-housing 142 and the orthographic projection of the bending structure 12 on the second sub-housing 142.

Figure 11:
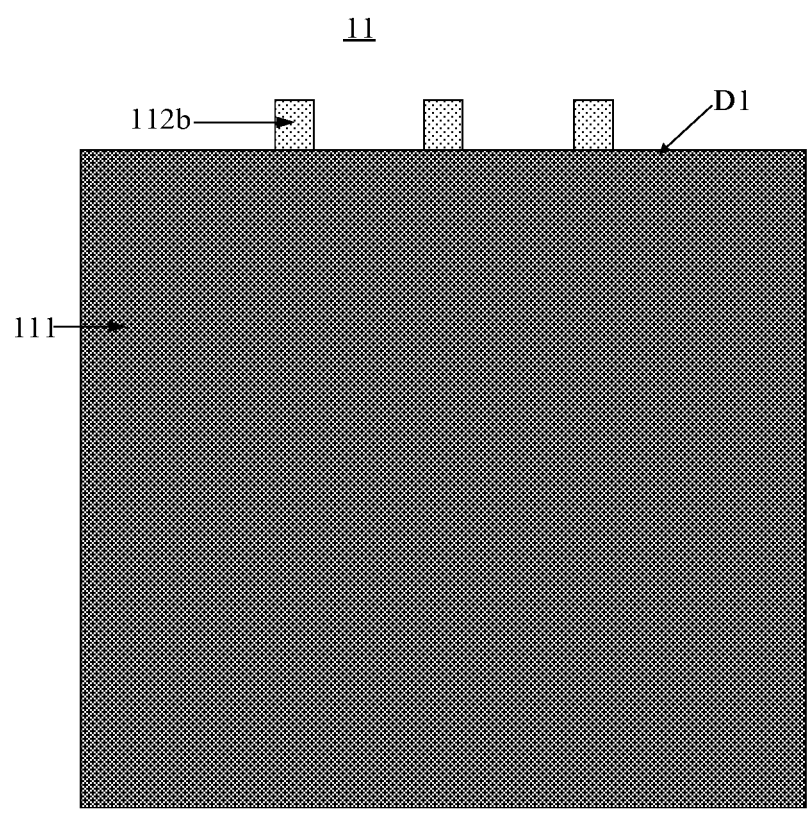
FIG. 11 is a schematic structural diagram of still another supporting structure provided by an embodiment of the present disclosure.

Furthermore, when the fixing members 112 include a plurality of second fixing members 112b, the plurality of second fixing members 112b may be distributed in the middle area of the third surface D1 at equal intervals. In this way, the forces received by the plurality of second fixing members 112b can be more balanced, and the supporting structure body can evenly support the bending part, thereby further reducing the probability that relative movement between the supporting structure body 111 and the second sub-housing 142 occurs. For example, as shown in FIG. 11, the fixing member 112 may include three second fixing members 112b, and the three second fixing members 112b are distributed in the middle area of the third surface D1 at equal intervals.

In a third case, the fixing member 112 may include a plurality of second fixing members 112b which are located at both ends of the third surface D1 and the middle area of the third surface D1 respectively.

A part of the plurality of second fixing members 112b may be located at one end of both sides of the third surface D1 of the supporting structure body 111, a part may be located at the other end of both sides of the third surface D1 of the supporting structure body 111, and another part may be located in the middle area of the third surface D1 of the supporting structure body 111. For example, a plurality of second fixing members 112b may be distributed on the third surface D1 at equal intervals, that is, the plurality of second fixing members 112b may be evenly distributed on the third surface D1 along a straight line. At this time, the distance between the adjacent second fixing members 112b is small, that is, the span of the two adjacent second fixing members 112b on the third surface D1 of the supporting structure body 111 is small, which can reduce the probability that the part of the supporting structure body 111 close to the bending part is bent. Therefore, the supporting structure body 111 can effectively support the bending part and thus the probability of damage to the bending part is further reduced.

Figure 12:
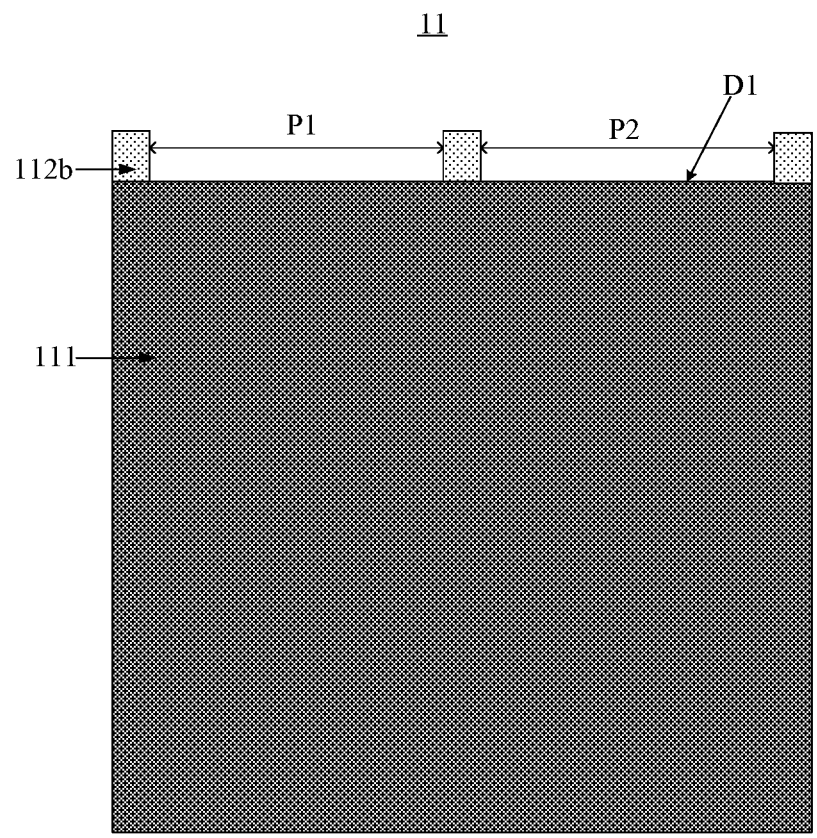
FIG. 12 is a schematic structural diagram of yet another supporting structure provided by an embodiment of the present disclosure.
Figure 13:
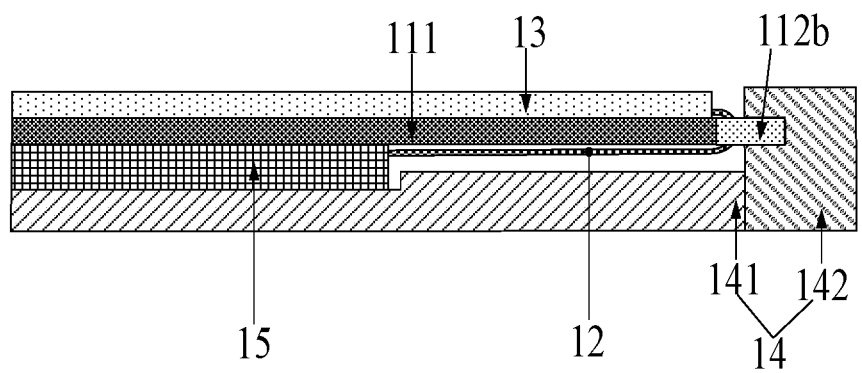
FIG. 13 is a schematic structural diagram of still another display apparatus provided by an embodiment of the present disclosure.

For example, referring to FIG. 12, the fixing members 112 include three second fixing members 112b: a first second fixing member 112b is located at the left end of the third surface D1 of the supporting structure body 111, a second second-fixing member 112b is located at the right end of the third surface D1 of the supporting structure body 111, and a third second fixing member 112b is located in the middle area of the third surface D1 of the supporting structure body 111. A distance P1 between the third second fixing member 112b and the first second fixing member 112b is equal to a distance P2 between the third second fixing member 112b and the second second-fixing member 112b. In this case, the three second fixing members 112b are distributed on the third surface D1 of the supporting structure body 111 at equal intervals. Optionally, the distance P1 may not be equal to the distance P2, which is not limited in the embodiment of the present disclosure.

In the second implementation, in a case that there is no overlap area between the orthographic projection of the second fixing member 112b on the second sub-housing 142 and the orthographic projection of the bending structure 12 on the second sub-housing 142, the second fixing member 112b may extend to the second sub-housing 142 via the side of the bending structure 12 and be fixedly connected to the second sub-housing 142. In a case that there is an overlap area between the orthographic projection of the second fixing member 112b on the second sub-housing 142 and the orthographic projection of the bending structure 12 on the second sub-housing 142, the bending structure 12 may be provided with a via and the second fixing member 112b can pass through the via in the bending structure 12 and be fixedly connected to the second sub-housing 142.

It should be noted that, in a case that the bending structure 12 includes a conductive structure, the conductive structure needs to avoid the position where the via is disposed (i.e., the conductive structure keeps away from the via) during the design of the bending structure 12, to ensure that the conductive structure can be used normally. Optionally, during the manufacture of a display apparatus, the size and position of the via can be pre-designed; and the size of the second fixing member 112b in the supporting structure 11 is determined according to the size of the via in the bending structure 12, and the position of the second fixing member 112b on the third surface D1 of the supporting structure 11 is determined based on the position of the via in the bending structure.

Optionally, the second fixing member 112b and the second sub-housing 142 may be fixedly connected in various ways, for example, an adhesive connection and/or a snap fit. For example, referring to FIG. 13, the second sub-housing 142 may have a groove, and the second fixing member 112b is fixedly connected to the inner wall of the groove. In this way, after the second fixing member 112b is fixedly connected to the inner wall of the groove, it is difficult for the second fixing member 112b to move towards the second sub-housing 142 under the obstruction of the inner wall of the groove, so that it is difficult for the supporting structure body 111 to move towards the second sub-housing 142.

It should be noted that the above several implementations can be combined with each other. For example, the first case in the first implementation can be combined with the second implementation, that is, a part of the fixing members are located on the first surface of the supporting structure body, and the other part of the fixing members are located on the third surface of the supporting structure body; or, the first case in the first implementation can be combined with the second case in the first implementation, that is, a part of the fixing members are located on the first surface of the supporting structure body, and the other part of the fixing members are located on the second surface of the supporting structure body; or, the second implementation may also be combined with the second case in the first implementation, that is, a part of the fixing members are located on the third surface of the supporting structure body, and the other part of the fixing members are located on the second surface of the supporting structure body; or, the first case in the first implementation, the second implementation, and the second case in the first implementation are combined, that is, a part of the fixing members are located on the first surface of the supporting structure body, a part of the fixing members are located on the third surface of the supporting structure body, and a part of the fixing members are located on the second surface of the supporting structure body.

In addition, the connection manner of the fixing members provided on different surfaces and the housing is not limited to the fixing manner described in the foregoing content. For example, the fixing member provided on the first surface may also be connected to the second sub-housing, or the fixing member provided on the third surface may also be fixedly connected to the first sub-housing, which is not specifically limited in the embodiment of the present disclosure.

Optionally, the display apparatus may further include a middle frame located at an end of the supporting structure body 111 away from the bending part. The second end of the supporting structure body away from the bending part may be fixedly connected to the middle frame. In addition, the supporting structure body and the middle frame may be fixedly connected in various ways, for example, an adhesive connection and/or a snap fit.

Figure 14:
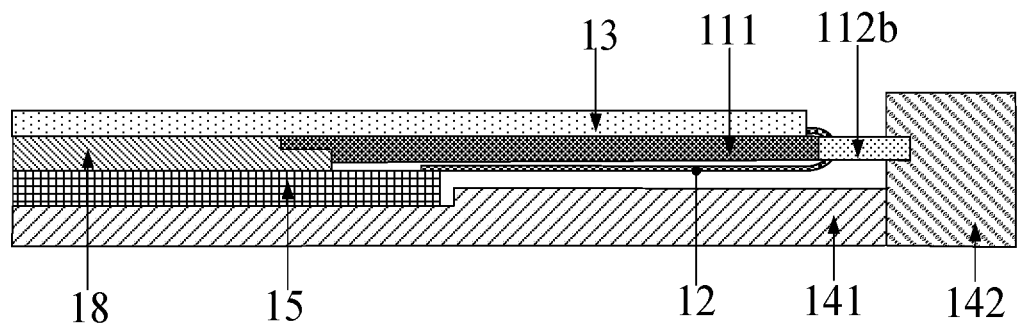
FIG. 14 is a schematic structural diagram of still another display apparatus provided by an embodiment of the present disclosure.

In an implementation, as shown in FIG. 14, the second end of the supporting structure body 111 may be fixedly connected to an end of the middle frame 18 close to the supporting structure body 111. In this case, the second end D2 of the supporting structure body 111 may have a first step-like structure, the end of the middle frame 18 close to the supporting structure body 111 may have a second step-like structure, and the second step-like shape matches the first step-like shape. The fixed connection between the supporting structure body 111 and the middle frame 18 can be achieved by engaging the first step-like structure and the second step-like structure.

Figure 15:
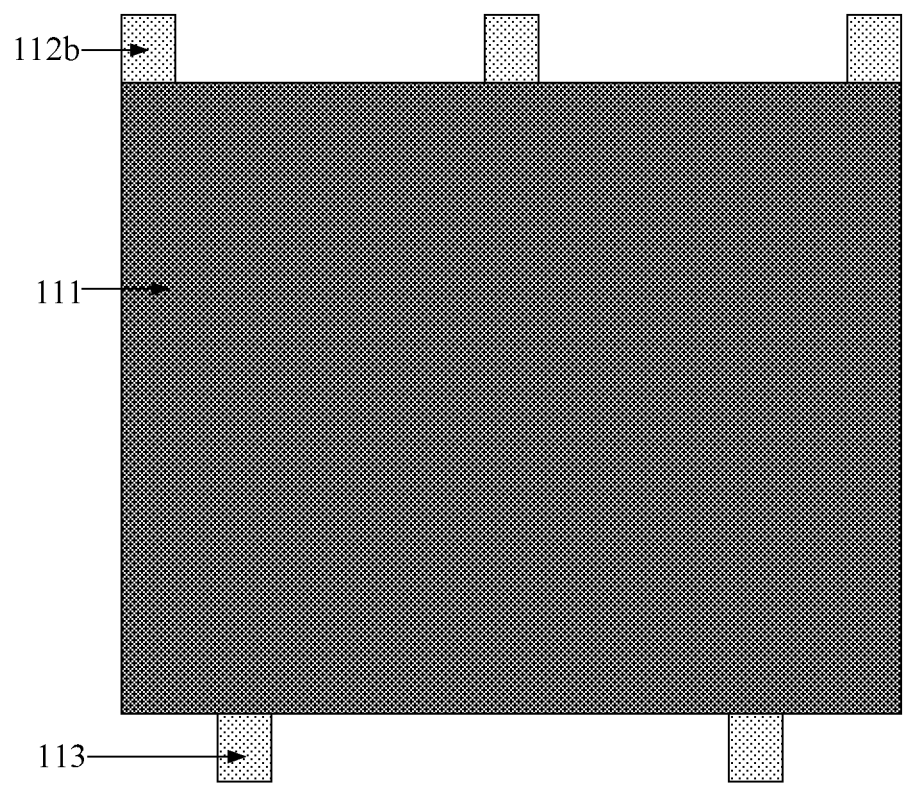
FIG. 15 is a schematic structural diagram of yet another supporting structure provided by an embodiment of the present disclosure.
Figure 16:
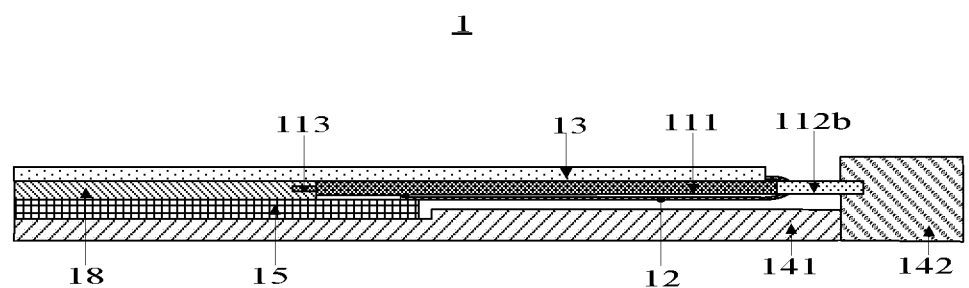
FIG. 16 is a schematic structural diagram of yet another display apparatus provided by an embodiment of the present disclosure.

In another implementation, as shown in FIGS. 15 and 16, the second end D2 of the supporting structure body 111 may have at least one strip connector 113, and the end of the middle frame 18 close to the supporting structure body has a groove that matches the strip connector 113, and the strip connector 113 is fixedly connected to the inner wall of the matched groove.

Optionally, referring to FIG. 6, the outer contour of the surface of the supporting structure body 111 close to the bending part may be arc-shaped, that is, the outer contour of the third surface D1 of the supporting structure body 111 is arc-shaped. This can reduce the probability of damage to the bending structure 12 when the third surface D1 is in contact with the bending structure 12.

The thickness of the end of the supporting structure body close to the bending part may be greater than that of the end of the supporting structure body away from the bending part. In this way, the rigidity of the end of the supporting structure body close to the bending part is large, so that the end of the supporting structure body close to the bending part is not easily deformed under the action of external force, thereby further improving the effect that the supporting structure body supports the bending structure.

The material of the supporting structure body may be a metal material, such as iron, steel, etc. In a case that the material of the supporting structure body is steel, the cost of the supporting structure body is lower since the cost of steel is lower. For example, in a case that the material of the supporting structure body is steel, the supporting structure body may also be called a steel sheet.

In summary, the supporting structure provided by the embodiments of the present disclosure includes a supporting structure body and a fixing member, and the supporting structure body is located in the gap inside the bending part of the bending structure, and the fixing member is fixedly connected to the housing, so that it is difficult for the supporting structure and the housing to move relative to each other. Compared with the related art, when the display apparatus is bent, it is difficult to alter the relative position of the housing and the bending structure so that it is difficult for the supporting structure and the bending structure to move relative to each other, which reduces the probability of the supporting structure body colliding with the bending part and reduces the probability of occurrence of failure of the bending structure at the bending part, thereby reducing the probability of occurrence of display failure of the display apparatus.

Figure 17:
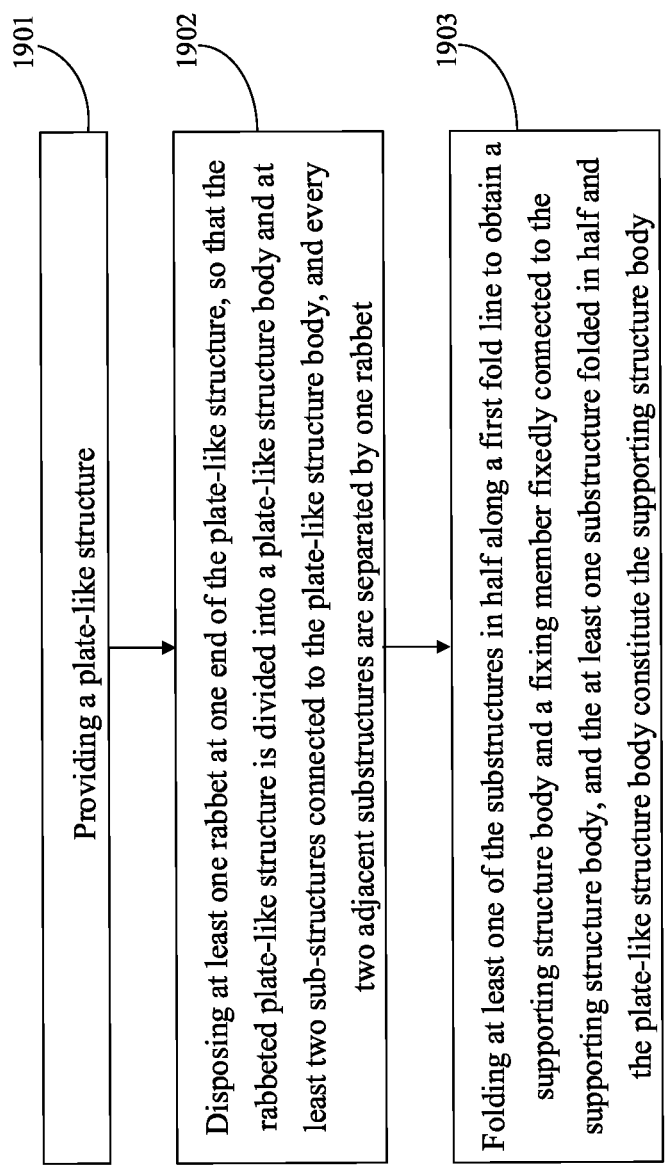
FIG. 17 is a flowchart of a method for manufacturing a supporting structure provided by an embodiment of the present disclosure.

The embodiments of the present disclosure provide a method for manufacturing a supporting structure, which can be used to manufacture the supporting structure in the above embodiments. As shown in FIG. 17, the method for manufacturing the supporting structure may include the following steps.

In step 1901, a plate-like structure is provided.

In step 1902, at least one rabbet is provided at one end of the plate-like structure, so that the rabbeted plate-like structure is divided into a plate-like structure body and at least two sub-structures connected to the plate-like structure body, and every two adjacent substructures are separated by one rabbet;

In step 1903, at least one of the substructures is folded in half along a first fold line to obtain a supporting structure body and a fixing member fixedly connected to the supporting structure body. The at least one substructure folded in half and the plate-like structure body constitute the supporting structure body.

Optionally, the implementation process of the step 1903 may include: folding at least one of the substructures in half along the first fold line to obtain the supporting structure body; and then folding other substructure(s) in half along a second fold line to obtain the fixing member. The other substructure(s) is the substructure in the at least two substructures except the at least one substructure.

Since the supporting structure body includes a part formed by folding at least one substructure in half along the first fold line, the folded part may be arc-shaped. In a case that the end with an arc-shaped outer contour is arranged close to the bending part, the probability of damage to the bending structure can be reduced when the end with an arc-shaped outer contour is in contact with the bending structure.

Moreover, since the supporting structure body includes a part formed by folding at least one substructure in half along the first fold line, the supporting structure body at this part has a relatively large thickness, thereby increasing the rigidity of the supporting structure body. In this way, the supporting structure body is not easily deformed under the action of external force, thereby improving the effect that the supporting structure body supports the bending structure.

Hereinafter, the above steps will be briefly described by taking the manufacturing of the supporting structures in FIGS. 4, 10, and 12 as examples. For methods of manufacturing supporting structures with other shapes, reference may be made to the methods for manufacturing supporting structures in FIGS. 4, 10, and 12, which are not described repeatedly in the embodiments of the present disclosure.

Figure 18:
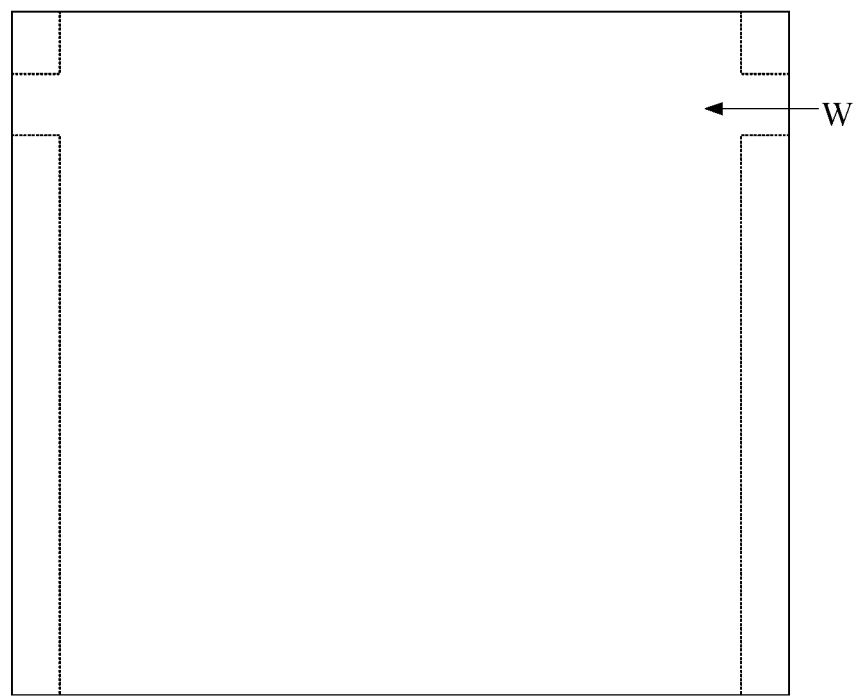
FIG. 18 is a schematic structural diagram of a plate-like structure provided by an embodiment of the present disclosure.
Figure 19:
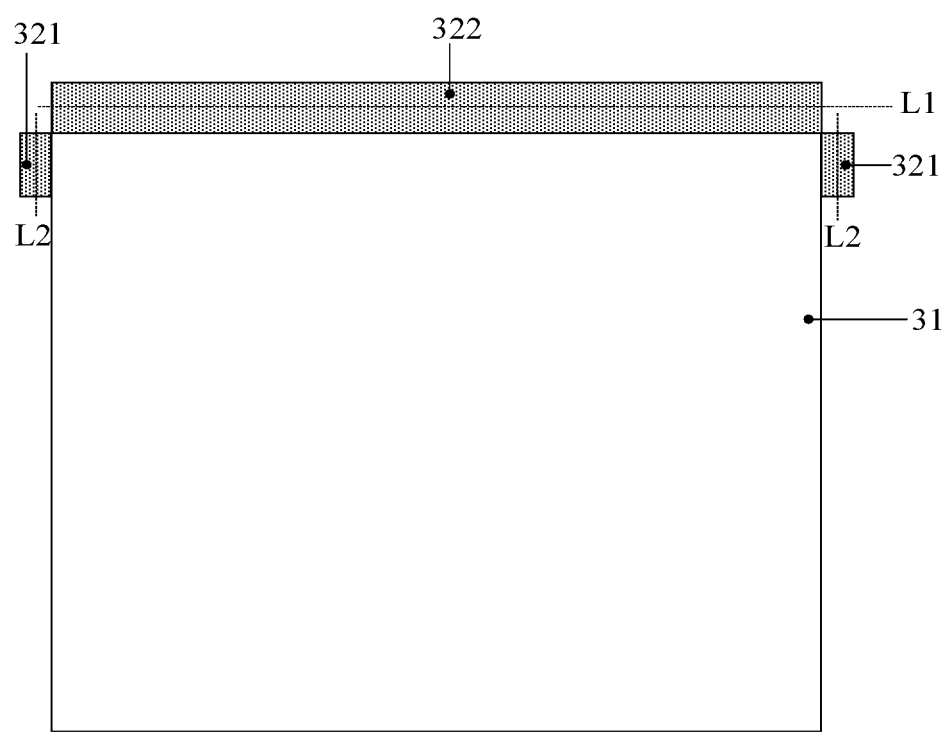
FIG. 19 is a schematic diagram of a cut plate-like structure provided by an embodiment of the present disclosure.

For example, in a case that the supporting structure shown in FIG. 4 is manufactured, after the plate-like structure W as shown in FIG. 18 is provided, the plate-like structure W can be cut along the dotted line in FIG. 18 to form rabbets at both sides of the plate-like structure W respectively, so as to obtain the structure shown in FIG. 19. The structure includes a plate-like structure body 31, two first sub-structures 321 respectively located at both sides of the plate-like structure body 31, and a second sub-structure 322 located at one end of the plate-like structure body 31. Then, the second sub-structure 322 is folded in half along the first fold line L1 to obtain the supporting structure body 111 as shown in FIG. 4. And each first substructure 321 is bent 90 degrees along the second fold line L2 to obtain two first fixing members 112a as shown in FIG. 4, thereby obtaining the supporting structure 11 as shown in FIG. 4.

Figure 10:
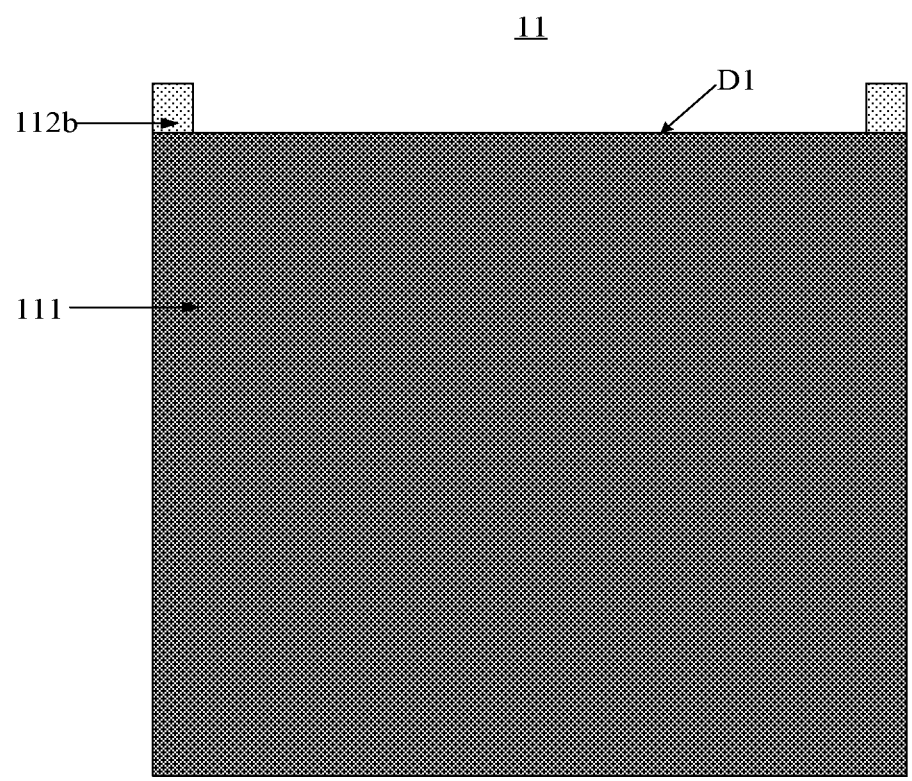
FIG. 10 is a schematic structural diagram of yet another supporting structure provided by an embodiment of the present disclosure.
Figure 20:
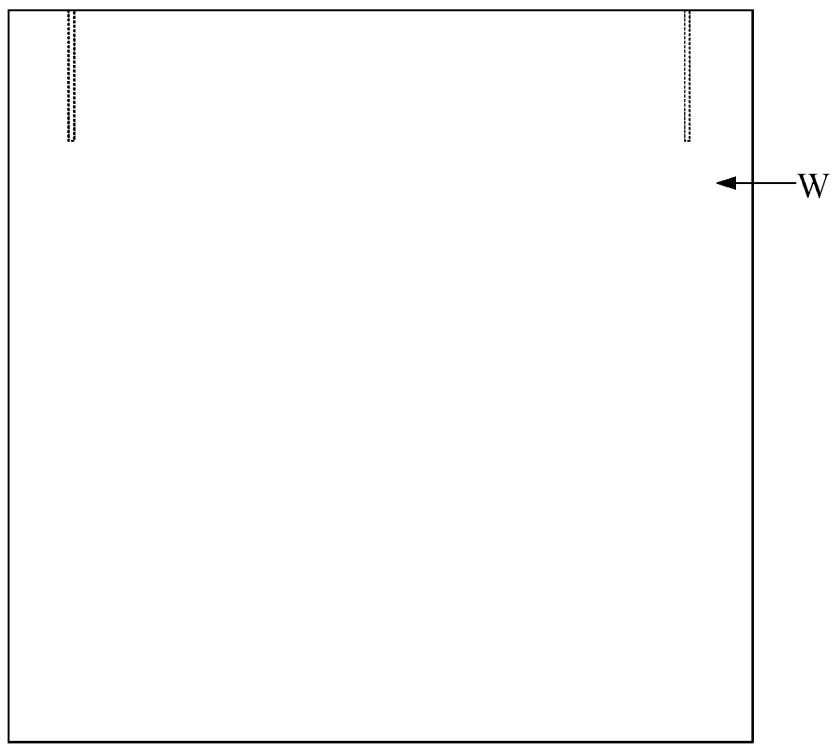
FIG. 20 is a schematic structural diagram of another plate-like structure provided by an embodiment of the present disclosure.
Figure 21:
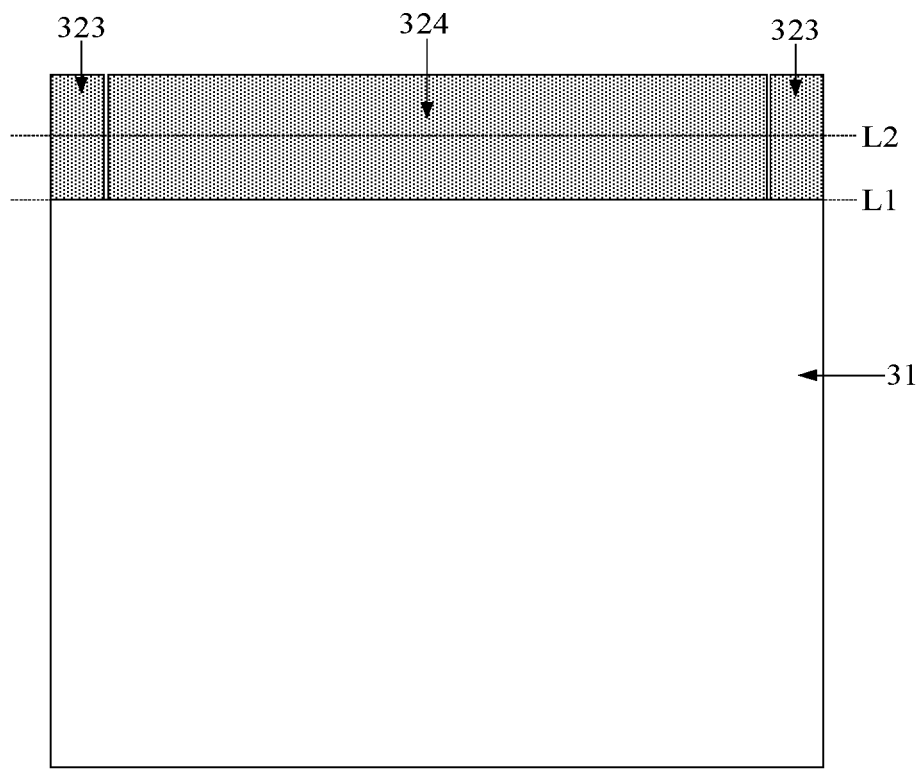
FIG. 21 is a schematic diagram of another cut plate-like structure provided by an embodiment of the present disclosure.

In a case that the supporting structure shown in FIG. 10 is manufactured, after the plate-like structure W as shown in FIG. 20 is provided, the plate-like structure W can be cut along the dotted line in FIG. 20 to form two rabbets at one end of the plate-like structure W, so as to obtain the structure shown in FIG. 21. The structure includes a plate-like structure body 31, and two third sub-structures 323 and a fourth sub-structure 324 which are located at one end of the plate-like structure body 31. The fourth sub-structure is located between the two third sub-structures. Then, the fourth substructure 324 is folded in half along the first fold line L1 to obtain the supporting structure body 111 as shown in FIG. 10, and each third substructure 323 is respectively folded in half along the second fold line L2 to obtain two second fixing members 112b as shown in FIG. 10, thereby obtaining the supporting structure 11 as shown in FIG. 10.

Figure 22:
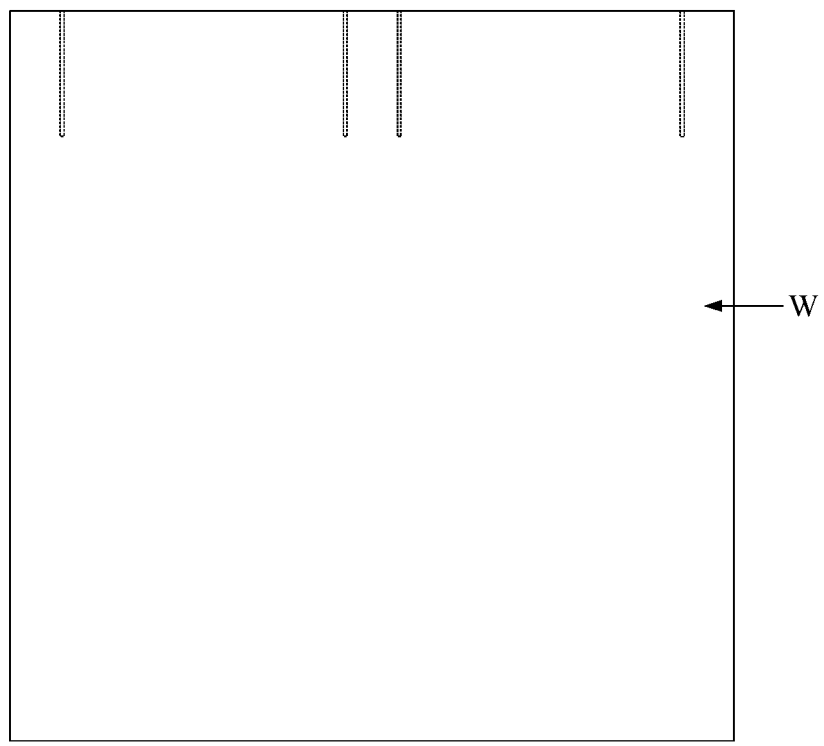
FIG. 22 is a schematic structural diagram of yet another plate-like structure provided by an embodiment of the present disclosure.
Figure 23:
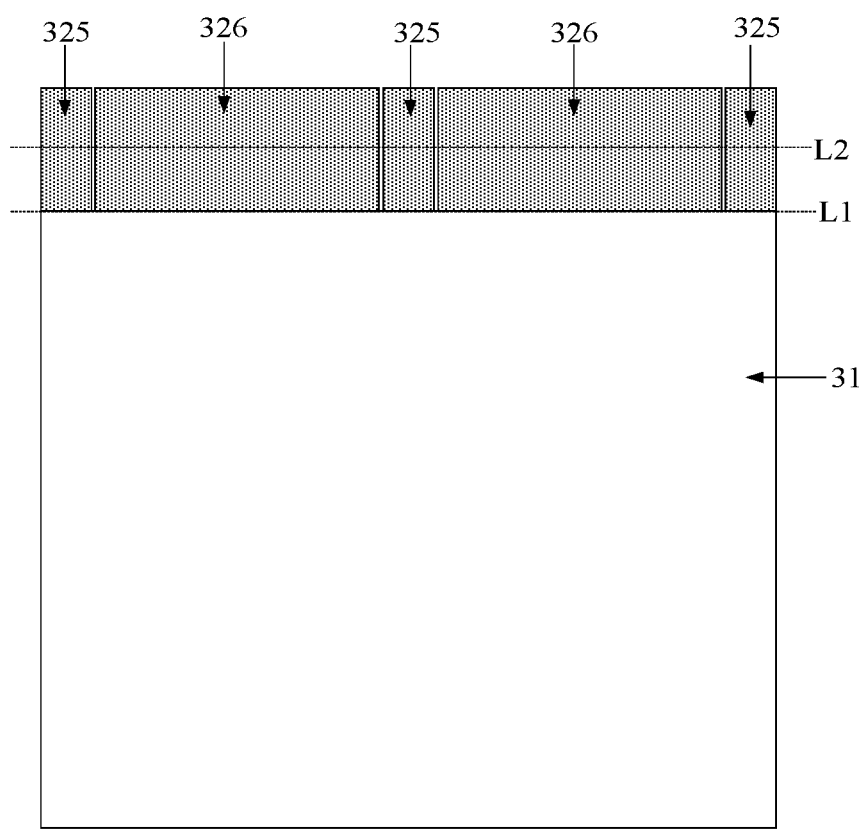
FIG. 23 is a schematic diagram of a cut plate-like structure provided by an embodiment of the present disclosure.

In a case that the supporting structure shown in FIG. 12 is manufactured, after the plate-like structure W as shown in FIG. 22 is provided, the plate-like structure W can be cut along the dotted line in FIG. 22 to form four rabbets at one end of the plate-like structure W, so as to obtain the structure as shown in FIG. 23. The structure includes a plate-like structure body 31, and three fifth sub-structures 325 and two sixth sub-structures 326 located at one end of the plate-like structure body 31. There is one sixth sub-structure 326 between two adjacent fifth sub-structures 325. Then, each sixth substructure 326 is folded in half along the first fold line L1 to obtain the supporting structure body 111 as shown in FIG. 12, and each fifth substructure 325 is folded in half along the second fold line L2 to obtain the three second fixing members 112b as shown in 12, thereby obtaining the supporting structure 11 as shown in FIG. 12.

In summary, in the method for manufacturing the supporting structure provided by the embodiments of the present disclosure, the manufactured supporting structure includes a supporting structure body and a fixing member, and the supporting structure body is located in a gap inside the bending part of the bending structure, and the fixing member is fixedly connected to the housing, so that it is difficult for the supporting structure and the housing to move relative to each other. Compared with the related art, when the display apparatus is bent, it is difficult to alter the relative position of the housing and the bending structure so that it is difficult for the supporting structure and the bending structure to move relative to each other, which reduces the probability of the supporting structure body colliding with the bending part, and reduces the probability of occurrence of failure of the bending structure at the bending part, thereby reducing the probability of occurrence of display failure of the display apparatus.

It should be noted that the embodiment of the method for manufacturing the supporting structure provided in the embodiment of the present disclosure can be cross-referenced with the corresponding embodiment of the supporting structure, which is not limited in the embodiment of the present disclosure. The sequence of the steps in the method embodiments provided by the embodiments of the present disclosure may be adjusted appropriately, and the steps can also be increased or decreased according to the situation. Within the technical scope disclosed in the present disclosure, any variations of the method easily derived by a person skilled in the art shall fall within the protection scope of the present disclosure, which is not repeated here.

Figure 24:
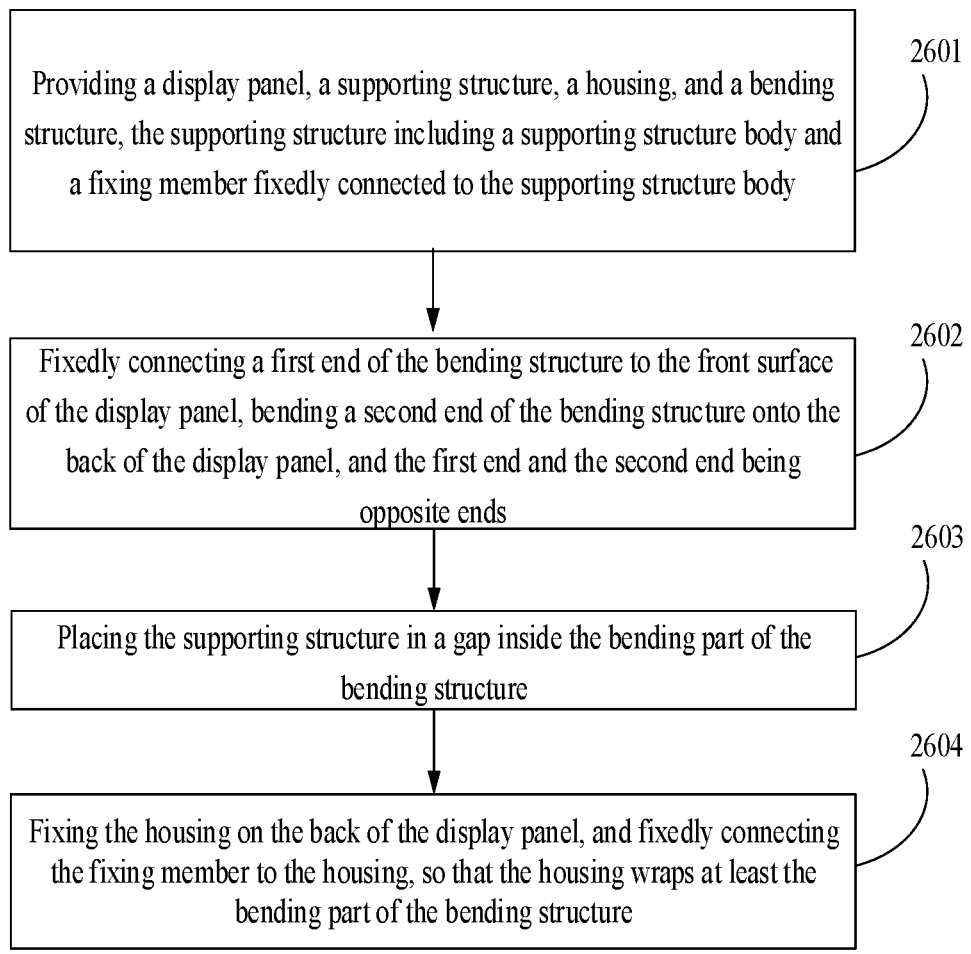
FIG. 24 is a flowchart of a method for assembling a display apparatus provided by an embodiment of the present disclosure.

The embodiment of the present disclosure provides a method for assembling a display apparatus, which can be used to assemble the display apparatus in the above embodiments. As shown in FIG. 24, the method of assembling the display apparatus may include the following steps.

In step 2601, a display panel, a supporting structure, a housing, and a bending structure are provided, and the supporting structure includes a supporting structure body and a fixing member fixedly connected to the supporting structure body;

In step 2602, the first end of the bending structure is fixedly connected to the front surface of the display panel, the second end of the bending structure is disposed on the back of the display panel, and the first end and the second end are opposite ends.

In step 2603, the supporting structure is placed in the gap inside the bending part of the bending structure.

In Step 2604, the housing is fixed on the back of the display panel, and the fixing member is fixedly connected to the housing, so that the housing wraps at least the bending part of the bending structure.

In summary, in the method of assembling the display apparatus provided by the embodiments of the present disclosure, the assembled display apparatus includes a supporting structure including a supporting structure body and a fixing member, and the supporting structure body is disposed in a gap inside the bending part of the bending structure, and the fixing member is fixedly connected to the housing, so that it is difficult for the supporting structure and the housing to move relative to each other. Compared with the related art, when the display apparatus is bent, it is difficult to alter the relative position of the housing and the bending structure so that it is difficult for the supporting structure and the bending structure to move relative to each other, which reduces the probability of the supporting structure body colliding with the bending part, and reduces the probability of occurrence of failure of the bending structure at the bending part, thereby reducing the probability of occurrence of display failure of the display apparatus.

It should be noted that in the accompanying drawings, for clarity of the illustration, the dimension of the layers and areas may be scaled up. It may be understood that when an element or layer is described as being "above" another element or layer, the described element or layer may be directly on the other element or layer, or an intermediate layer may be arranged between the described element or layer and the other element or layer. In addition, It may be understood that when an element or layer is described as being "below" another element or layer, the described element or layer may be directly below the other element or layer, or at least one intermediate layer or element may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole description described above, like reference numerals denote like elements.

The term "and/or" in the present disclosure only describes the correspondence of the corresponding objects, indicating three kinds of relationship. For example, A and/or B, may be expressed as: A exists alone, A and B exist concurrently, B exists alone. In addition, the character "/" generally indicates that the context objects is an "OR" relationship.

In the present disclosure, the terms "first" and "second" are used for descriptive purposes only and are not to be construed as indicating or implying relative importance. The term "at least one" refers to one or more, unless specifically defined otherwise. The term "plurality" refers to two or more, unless specifically defined otherwise.

The above are just the optional embodiments of the present disclosure, which will not limit the present disclosure. Any modifications, equivalent replacements and improvements made within the spirits and principles of the present disclosure shall all fall in the protection scope of the present disclosure.

What is claimed is:

1. A supporting structure comprising: a supporting structure body and a fixing member fixedly connected to the supporting structure body,
    wherein the supporting structure body is located in a gap inside a bending part of a bending structure of a display apparatus, a first end of the bending structure is fixedly connected to a front surface of a display panel in the display apparatus, a second end of the bending structure is located on a back of the display panel, and the first end and the second end are opposite ends; and
    wherein the display apparatus further comprises a housing at least wrapping the bending part of the bending structure, and the fixing member is fixedly connected to the housing; and
    wherein the housing comprises a second sub-housing wrapping the bending part; and
    the fixing member comprises at least one second fixing member fixedly connected to the second sub-housing.

2. The supporting structure according to claim 1, wherein the housing comprises a first sub-housing wrapping a part of the bending structure bent to the back of the display panel; and
    the fixing member comprises at least one first fixing member fixedly connected to the first sub-housing.

3. The supporting structure according to claim 2, wherein the first fixing member is located on a first surface of the supporting structure body, and the first surface is a surface of the supporting structure body except a surface for supporting the bending structure.

4. The supporting structure according to claim 3, wherein the fixing member comprises a plurality of first fixing members symmetrically located on part or all of at least one pair of first surfaces facing each other.

5. The supporting structure according to claim 2, wherein the first fixing member is located on a second surface of the supporting structure body, and the second surface faces the part of the bending structure bent to the back of the display panel.

6. The supporting structure according to claim 2, wherein the first sub-housing has a groove, and the first fixing member is snap-fitted in the groove.

7. The supporting structure according to claim 1, wherein the second fixing member is located on a third surface of the supporting structure body towards the bending part.

8. The supporting structure according to claim 7, wherein the fixing member comprises a plurality of second fixing members evenly distributed on the third surface.

9. The supporting structure according to claim 1, wherein the second sub-housing has a groove, and the second fixing member is fixedly connected to an inner wall of the groove.

10. The supporting structure according to claim 1, wherein the fixing member extends to the housing via a side of the bending structure, and is fixedly connected to the housing; or
    the fixing member is fixedly connected to the housing through a via in the bending structure.

11. The supporting structure according to claim 1, wherein the display apparatus further comprises a middle frame located at one end of the supporting structure body away from the bending part, and the supporting structure is further fixedly connected to the middle frame.

12. The supporting structure according to claim 11, wherein one end of the supporting structure body close to the middle frame has a first step-like structure, one end of the middle frame close to the supporting structure body has a second step-like structure, and the supporting structure body and the middle frame are fixedly connected by engagement of the first step-like structure and the second step-like structure.

13. The supporting structure according to claim 1, wherein a thickness of one end of the supporting structure body close to the bending part is greater than that of one end of the supporting structure body away from the bending part.

14. The supporting structure according to claim 1, wherein an outer contour of a surface of the supporting structure body close to the bending part is arc-shaped.

15. The supporting structure according to claim 1, wherein the bending structure comprises a conductive structure.

16. A display apparatus comprising the display panel, the bending structure in a bent state, the housing and the supporting structure according to claim 1.

17. A method for assembling a display apparatus, wherein the display apparatus is the display apparatus according to claim 16 and the method comprises:
    providing the display panel, the supporting structure, the housing, and the bending structure, the supporting structure comprising the supporting structure body and the fixing member fixedly connected to the supporting structure body;
    fixedly connecting the first end of the bending structure to the front surface of the display panel, the second end of the bending structure being located on the back of the display panel, and the first end and the second end being opposite ends;
    placing the supporting structure in the gap inside the bending part of the bending structure; and
    fixing the housing on the back of the display panel, and fixedly connecting the fixing member to the housing, wherein the housing wraps at least the bending part of the bending structure.

18. A method for manufacturing a supporting structure, wherein the supporting structure is the supporting structure according to claim 1 and the method comprises:
    providing a plate-like structure;
    disposing at least one rabbet at one end of the plate-like structure, the rabbeted plate-like structure being divided into a plate-like structure body and at least two sub-structures connected to the plate-like structure body, and every two adjacent substructures being separated by one rabbet; and folding at least one of the substructures in half along a first fold line to obtain a supporting structure body and a fixing member fixedly connected to the supporting structure body, wherein the at least one substructure folded in half and the plate-like structure body constitute the supporting structure body.

19. The method according to claim 18, wherein, the folding at least one of the substructures in half along the first fold line to obtain the supporting structure body and the fixing member fixedly connected to the supporting structure body, comprises:

folding the at least one of the substructures in half along the first fold line to obtain the supporting structure body; and folding other substructure(s) in half along a second fold line to obtain the fixing member, the other substructure(s) being substructure(s) in the at least two substructures expect the at least one substructure.

\* \* \* \* \*